United States Patent [19]

Herrington

[11] Patent Number: 5,084,421
[45] Date of Patent: Jan. 28, 1992

[54] SILVER-GLASS PASTES

[75] Inventor: Thomas L. Herrington, Ramona, Calif.

[73] Assignee: Johnson Matthey, Inc., Valley Forge, Pa.

[21] Appl. No.: 558,327

[22] Filed: Jul. 27, 1990

[51] Int. Cl.⁵ ............................................... C03C 8/18
[52] U.S. Cl. .................................... 501/19; 501/20; 501/22; 501/24; 501/46; 106/1.14
[58] Field of Search ............. 501/19, 20, 22, 24, 501/46; 106/1.14

[56] References Cited

U.S. PATENT DOCUMENTS

| | | | |
|---|---|---|---|
| 3,497,774 | 2/1970 | Hornberger et al. | 357/65 |
| 4,401,767 | 8/1983 | Dietz et al. | 501/19 |
| 4,436,785 | 3/1984 | Dietz et al. | 501/19 |
| 4,459,166 | 7/1984 | Dietz et al. | 501/19 |
| 4,636,254 | 1/1987 | Husson, Jr. et al. | 106/1.19 |
| 4,761,224 | 8/1988 | Husson, Jr. et al. | 106/1.14 |
| 4,859,241 | 8/1989 | Grundy | 106/1.14 |
| 4,881,974 | 11/1989 | Herrington | 106/1.14 |

*Primary Examiner*—Mark L. Bell
*Assistant Examiner*—Deborah Jones
*Attorney, Agent, or Firm*—Cushman, Darby & Cushman

[57] ABSTRACT

An improved sliver-glass paste for bonding a semiconductive element to a substrate comprising silver flake, glass frit, a surfactant, a thixotrope and a low boiling paraffinic hydrocarbon solvent.

6 Claims, No Drawings

SILVER-GLASS PASTES

BACKGROUND OF THE INVENTION

The present invention relates to improved silver-glass paste compositions useful for attaching semiconductive elements, e.g. silicon dies, GaAs elements or the like, to appropriate substrates, and to a method for forming electronic components using such pastes.

Prior patents directed to pastes of this general type include U.S. Pat. Nos. 3,497,774; 4,401,767; 4,436,785; 4,459,166; 4,636,254; 4,761,224 and 4,881,974. Typically, these pastes are used for attaching silicon dies to ceramic substrates.

Other improved silver-glass paste compositions are described in U.S. Ser. No. 07/248,120, filed Sept. 23, 1988 now U.S. Pat. No. 4,986,849; Ser. No. 07/288,640, filed Dec. 22, 1988 and Ser. No. 07/482,489, filed Feb. 21, 1990, the subject matter of these applications being incorporated herein by reference.

The pastes known in the art typically include the following essential components in the approximate ranges indicated below:

| Component | % by weight |
|---|---|
| silver flake | 55–80 |
| glass frit | 10–25 |
| (e.g. lead borate glass) | |
| resin or resin-forming component (e.g. a methacrylate) | 0.0–2 |
| organic solvent | 5–20 |

Other additives, e.g. silver oxide, thixotropic agents, surfactants, or the like also may be included.

In a representative die-attachment process, the paste comprising silver flake, glass frit, resin and solvent is placed in a cavity in a ceramic substrate, the die is placed on the paste and the resulting die/substrate package is fed on a belt through a furnace where the package is heated to remove the organic solvent and sinter the residual silver and glass to bond the die firmly to the substrate. The final bond layer must be completely free of voids. As a consequence, the process usually requires a preliminary drying step in which solvent and other volatiles are evaporated, followed by firing in a furnace to remove residual volatiles and melt the glass.

The preliminary drying step of necessity is quite lengthy, requiring between about 2–10 hours at 60°–80° C., depending on, for example, the size of the die and the surface area of the silver flake particles. Additionally, the ramp rate, i.e. the rate at which the package is fed from the drying step into the furnace, is carefully controlled so as to ensure that organic burnout is at least essentially completed before the sintering of the silver-glass mix takes place. Relatively low temperature ramp rates (e.g. up to 50° C./minute) are very commonly used to insure solvent removal and optimum results. Belt-type furnaces are normally employed for the firing stage and, depending on the number of temperature zones involved, the dwell time in the furnace can vary from 30–90 minutes or more.

When a large die is bonded, e.g. a die of 400–500 square mils or more, a large amount of bonding agent is needed, and, consequently, a significant amount of solvent and other volatiles must be evaporated. To insure sufficient evaporation of the volatiles, the drying process may be particularly lengthy and the required ramp rate may be relatively low. The drying time can be decreased by using small silver flakes, which are packed more densely than large flakes and thus permit a faster rate of evaporation. However, when small flakes are used, cracks are likely to form in the bond because sintering tends to proceed too quickly. Thus, effective attachment of a large die to a substrate using conventional methods generally requires the use of large silver particles, and, therefore, a lengthy drying process and use of a relatively low temperature ramp rate.

SUMMARY OF THE INVENTION

The pastes of the invention permit the elimination of the preliminary drying step and faster overall processing while providing a void- and crackfree bond layer for die attachment, even for large dies. While a drying step may be used, if desired, the present pastes can be used effectively, without a preliminary drying step, in a single pass through the furnace at a high temperature ramp rate while maintaining high performance requirements. Other advantages of the present pastes will be hereinafter apparent.

Broadly speaking, the pastes of the invention are characterized by including, along with the basic paste components (silver flake and glass frit), a particular type of organic solvent, a surfactant and a thixotrope. A resin or precursor therefor, e.g. an alkyl methacrylate, may also be included.

DETAILED DESCRIPTION OF THE INVENTION

The pastes of the invention consist essentially of the following:

| Component | % by weight |
|---|---|
| silver flake | 55–80 |
| glass frit | 8–25 |
| resin | 0–2 |
| thixotrope | 0.2–2 |
| surfactant | 0.05–2 |
| solvent | 5–20 |

The success of the present pastes is due, in large measure, to the use of a solvent which has a low boiling point, e.g. around 100°–250° C., in combination with the other indicated paste components. Preferably the solvent is a paraffinic hydrocarbon, notably an isoparaffin such as Exxon Isopar L. The amount of solvent used is preferably kept at the minimum which permits easy handling and application of the paste.

Use of a low boiling solvent in pastes according to the invention has been found to permit the paste to be effectively used without the need for preliminary drying although, as noted, a drying step may be used if desired. It has been found that a noticeable improvement results when using isoparaffin solvents in that these seem to provide better wetting of silicon die and substrate surfaces. As a consequence, higher and tighter adhesion distribution is obtained. Voiding between the silicon die and substrate interface is also greatly reduced to, for example, less than 3% of the area involved. This is apparently due to the improved evaporation rates offered by the paraffinic solvent.

Any non-ionic or ionic surfactant which includes both a lyophobic group and a lyophilic group as described in copending U.S. application Ser. No. 07/248,120 may be used for present purposes. Preferably a non-ionic surfactant is used but ionic surfactants also give useful results. It is, however, essential that the surfactant include both a lyophobic group and a lyophilic group and this component should be stable at temperatures above about 300° C., i.e. close to or above the temperature where sintering of the silver-glass mix begins. Advantageously, the lyophobic group is a long chain hydrocarbon radical while the lyophilic group is an ionic or highly polar group. As examples of lyophobic groups, there may be mentioned:

$C_8-C_{20}$ straight or branched chain alkyl;

phenyl groups substituted with $C_8-C_{20}$ alkyl;

naphthyl groups substituted with alkyl containing 3 or more carbons;

rosin derivatives;

high molecular weight propylene oxide polymers (polyoxypropylene glycol derivatives); or the like.

As the lyophilic component, there may be mentioned such non-ionic materials as the monoglyceride of long chain fatty acids of the formula $RCOOCH_2CHOHCH_2OH$ where R is a long chain alkyl (e.g. $C_{12}$ or more) and/or polyoxytehylenated alkyl phenols of the formula $R-C_6H_4(OC_2H_4)_xOH$ where R is alkyl of 8 to 20 carbons and x is an integer, e.g. from 1 to 70, sulfated derivatives thereof and the alkali metal salts of such derivatives.

As specific examples of surfactants containing both lyophobic and lyophilic groups suitable for use herein, there may be mentioned: Triton X (the sodium salt of an octylphenol which is ethoxylated and sulfated), Pluronic Tetronic (fatty amine ethoxylate), Post-4 (hydrogenated castor oil), Tinagel (fatty amine ethoxylate), Lecithin (δ-N-alkylamino propionic acid). Triton X-45, which is identified as an octylphenoxypolyethanol, is a preferred non-ionic surfactant for use herein. As noted, the amount of surfactant can be varied from 0.05-2% by weight of the paste.

The thixotrope is preferably hydrogenated castor oil comprising about 0.2 to 2.0% by weight of the paste. This component helps to form a three-dimensional network structure which increases the paste yield point to prevent dripping in dispensing and particle settling during storage. More particularly, the thixotrope provides a lower viscosity at high sheer rate which prevents string formation of the paste during dispensing and fast yield point recovery for better pattern definition.

A preferred thixotrope for use herein is the hydrogenated castor oil available commercially as "Thixcin R". This will normally be used in an amount within the range of 0.3 to 2.0% by weight of the paste.

A variety of different resin components can be used for present purposes. This includes lower alkyl methacrylates such as methyl, ethyl or isobutyl methacrylate, the latter being preferred. This component usually comprises from about 0.3-2.0% by weight of the paste although a lesser amount may be used and it may be omitted completely in some cases.

The glass component is advantageously either lead borate glass frit which is silica- or sodium-free or, preferably, a lead phosphate vanadate glass as described in pending U.S. application Ser. No. 07/288,640. The glass softening range preferably should be in the range of 250°-350° C.

The silver flake should have a surface area of about 0.4–1.0 $m^2/g$ and a tap density of 2.0-4.0 g/cc. It is desirable that the flake be essentially uniform in size although size variations are possible.

The pastes of the invention may be formulated and used in the manner known in the art with the benefit of faster processing times and elimination of the preliminary drying step if this is desired.

EXAMPLE

A preferred paste according to the invention is described below:

| | |
|---|---|
| silver flake | 77.44% |
| lead phosphovanadate glass (softening point 320° C.) | 10.56% |
| resin | 0.00% |
| thixotrope (Thixcin R) | 0.35% |
| surfactant (Triton X-45) | 0.50% |
| solvent (Isopar L) | 11.15% |

It has been found that the above formulation, as representative of the pastes of the invention, can be used to assemble semiconductor devices to be processed at peak firing temperatures of less than 400° C. and heating rates of up to 120° C./minute. The formulation also provides improved paste wetting on silicon and substrate surfaces.

The table set out below shows the differences in results obtained using the above paste according to the invention and a prior paste both with and without a preliminary drying step.

| | | | Adhesion (lbs.) | | |
|---|---|---|---|---|---|
| Processing | Die Size | % Wetting | Min | Max. | Avg. |
| Prior Paste | | | | | |
| Dry for 1.0 hour @ 75 C. Peak firing temp. 390 C. | .6" × .6" | 5% | 33 | 57 | 45 |
| No drying Peak firing temp. 390 C. | | 10% | 24 | 35 | 31 |
| Present Paste | | | | | |
| Dry for 1.0 hour @ 75 C. Peak firing temp. 390 C. | .6" × .6" | 75% | 92 | 106 | 99.6 |
| No drying Peak firing temp. 390 C. | | 85% | 101 | 145 | 121 |

As will be evident, the present paste shows much greater wetting characteristics and better adhesion both with and without a preliminary drying step under comparable conditions.

The prior paste used for the comparison given above, had the following composition:

| | |
|---|---|
| silver flake | 74.8% |
| lead phosphovanadate glass | 10.2% |
| resin | 0.6% |
| surfactant (Triton X-100) | 0.5% |
| solvent (Texanol) | 8.34 |
| solvent (EGDA Ethylene glycol diacetate) | 5.56% |

It will be appreciated that various modifications may be made in the above exemplified paste without departing from the scope of the invention as defined in the following claims wherein:

I claim:

1. In a silver-glass paste comprising silver flake, glass frit, surfactant, thixotrope and a solvent, the improvement which comprises using as a solvent, a low boiling paraffinic hydrocarbon solvent.

2. A paste according to claim 1 wherein the solvent is an isoparaffin.

3. A paste according to claim 2 wherein the glass frit comprises a lead borate or lead phosphovanadate glass frit; and the surfactant is an ionic or non-ionic surfactant including both a lyophobic group and a lyophilic group.

4. A paste according to claim 3 wherein the thixotrope is hydrogenated castor oil, the surfactant is octylphenoxypolyethanol and the solvent is an isoparaffin boiling at 100°-250° C.

5. A paste according to claim 4 including resin component.

6. A paste according to claim 5 consisting essentially of, by weight, 55-80% silver flake; 8-25% glass frit; 0-2% resin component; 0.2-2% thixotrope; 0.05-2% surfactant; and 5-20% solvent.

* * * * *